US011976356B2

(12) United States Patent
Nakatani et al.

(10) Patent No.: US 11,976,356 B2
(45) Date of Patent: May 7, 2024

(54) VAPORIZED FEED DEVICE (71) Applicant: FUJIKIN INCORPORATED, Osaka (JP)

(72) Inventors: Takatoshi Nakatani, Osaka (JP); Atsushi Hidaka, Osaka (JP); Ichiro Tokuda, Osaka (JP); Keisuke Nakatsuji, Osaka (JP)

(73) Assignee: FUJIKIN INCORPORATED, Osaka (JP)

( * ) Notice: Subject to any disclaimer, the term of this patent is extended or adjusted under 35 U.S.C. 154(b) by 195 days.

(21) Appl. No.: 17/639,288

(22) PCT Filed: Sep. 3, 2020

(86) PCT No.: PCT/JP2020/033395
§ 371 (c)(1),
(2) Date: Feb. 28, 2022

(87) PCT Pub. No.: WO2021/054135
PCT Pub. Date: Mar. 25, 2021

(65) Prior Publication Data
US 2022/0403508 A1    Dec. 22, 2022

(30) Foreign Application Priority Data
Sep. 19, 2019   (JP) ................. 2019-170271

(51) Int. Cl.
*C23C 16/448*   (2006.01)
*C23C 16/52*    (2006.01)
(52) U.S. Cl.
CPC ........... *C23C 16/448* (2013.01); *C23C 16/52* (2013.01)

(58) Field of Classification Search
CPC ............. C23C 16/448; C23C 16/4485; C23C 16/45561; B01B 1/005
See application file for complete search history.

(56) References Cited

U.S. PATENT DOCUMENTS

| 2011/0100483 A1 | 5/2011 | Nagata et al. |
| 2015/0322567 A1 | 11/2015 | Hidaka et al. |
| 2016/0178193 A1 | 6/2016 | Taguchi et al. |
| 2018/0071702 A1 | 3/2018 | Hidaka et al. |
| 2020/0199753 A1 | 6/2020 | Hidaka et al. |

FOREIGN PATENT DOCUMENTS

| JP | 2009-252760 A | 10/2009 |
| JP | 2010-180429 A | 8/2010 |
| JP | 2014-114463 A | 6/2014 |
| JP | 2016-122841 A | 7/2016 |
| WO | 2016/174832 A1 | 11/2016 |
| WO | 2019/021949 A1 | 1/2019 |

OTHER PUBLICATIONS

International Search Report issued in PCT/JP2020/033395; dated Dec. 1, 2020.

*Primary Examiner* — Joseph A Miller, Jr.
(74) *Attorney, Agent, or Firm* — Studebaker & Brackett PC (57) ABSTRACT

A vaporization supply apparatus 1 includes a preheating section 2 for preheating a liquid raw material L, a vaporization section 3 provided on top of the preheating section 2 for heating and vaporizing the preheated liquid raw material L sent from the preheating section 2, a flow rate control device 4 provided on top of the vaporization section 3 for controlling the flow rate of a gas G sent from the vaporization section 3, and heaters 5 for heating the preheating section 2, the vaporization section 3 and the flow rate control device 4.

7 Claims, 4 Drawing Sheets

VAPORIZED FEED DEVICE

TECHNICAL FIELD

The present invention relates to a vaporization supply apparatus used in a semiconductor manufacturing equipment, a chemical plant, a pharmaceutical industry facility, or the like, and more particularly, to a vaporization supply apparatus having a preheating section for preheating a liquid raw material and a vaporization section for vaporizing the liquid raw material heated in the preheating section.

BACKGROUND OF INVENTION

Conventionally, a vaporization supply apparatus for supplying a source gas to a process chamber has been used, for example, in semiconductor manufacturing equipment for depositing a film by the metal organic chemical vapor deposition (MOCVD) method (see, for example, Patent Documents 1 to 3).

As the vaporization supply apparatus, for example, there is a device in which a liquid raw material such as TEOS (Tetraethyl orthosilicate) or HCDS (Hexachlorodisilane) is stored in a storage tank, pressurized inert gas is supplied to the storage tank, and the liquid raw material is pushed out at constant pressure and supplied to a vaporizer. The supplied liquid raw material is vaporized by heaters provided around the vaporization chamber, and the vaporized gas is supplied to the semiconductor manufacturing equipment at a predetermined flow rate controlled by a flow rate control device.

Certain organometallic material used as the raw material has a boiling point of greater than 150° C., and for example, the boiling point of the above TEOS is about 169° C. For this reason, the vaporization supply apparatus is configured to be able to heat the liquid raw material to a relatively high temperature, for example, a temperature of 200° C. or higher.

Further, in order to prevent condensation (reliquefaction) of the vaporized raw material, the vaporization supply apparatus is required to supply gas to the process chamber through a flow path heated to a high temperature. Further, in order to prevent the temperature decreasing of the vaporizer by the liquid raw material supplied to the vaporizer and to efficiently perform vaporization of an organometallic material or the like, in some cases, the liquid raw material is previously heated before being supplied to the vaporizer. Thus, in the vaporization supply apparatus, a heater for heating a fluid heating section (a vaporizer or the like) provided with a flow path or a fluid housing part to a high temperature is provided at a necessary position.

As a vaporization supply apparatus provided with a preheating section for preheating a liquid raw material, for example, a vaporization supply apparatus described in Patent Document 4 and Patent Document 5 is known.

The vaporization supply apparatus includes a preheating section for preheating the raw material liquid, a vaporizer for vaporizing the raw material liquid heated by the preheating section, and a high-temperature compatible pressure type flow rate control device for controlling the flow rate of the vaporized gas.

PRIOR-ART DOCUMENT

Patent Literature

Patent Document 1: Japanese Patent Laid Open Publication No. 2009-252760

Patent Document 2: Japanese Patent Laid Open Publication No. 2010-180429
Patent Document 3: Japanese Patent Laid Open Publication No. 2014-114463
Patent Document 4: International Publication No. WO2016/174832
Patent Document 5: International Publication No. WO2019/021949

SUMMARY OF INVENTION

Problems to be Solved by Invention

In the vaporization supply apparatus described above, a preheating section provided for preheating a liquid raw material is maintained at a temperature not higher than a boiling point of the liquid raw material, for example, and a vaporization section is maintained at a temperature not lower than the boiling point of the liquid raw material, for example. However, since the boiling point of the fluid varies depending on the pressure of the fluid, even if the temperature of the preheating section becomes equal to or higher than the boiling point at the normal pressure (atmospheric pressure) of the liquid raw material, the state of the liquid may be maintained without vaporization depending on the pressure of the liquid raw material. In addition, when a raw material having a thermal decomposition temperature lower than the boiling point is used, the temperature of the vaporization section may be set lower than or equal to the boiling point. The set temperature of the vaporizing section is usually higher than the set temperature of the preheating section. Further, the pressure type flow rate control device for controlling the flow rate of the vaporized liquid raw material is maintained at a high-temperature higher than the boiling point of the liquid raw material, typically higher than the temperature of the vaporizing section.

However, in the vaporization supply device having a preheating section and a vaporization section, since the preheating section, the vaporization section, and the pressure type flow rate control device are arranged in series, a problem of the installation area expansion inevitably occurs. For this reason, the vaporization supply apparatus may not be installed in the vicinity of the process chamber in some cases.

The present invention has been made to solve the above-mentioned problems, and the main object of the present invention is to provide a vaporization supply apparatus capable of decreasing the installation area.

Means for Solving Problem

In order to achieve the above object, the vaporization supply apparatus according to embodiments of the present invention includes a preheating section for preheating a liquid raw material; a vaporization section provided on top of the preheating section for heating and vaporizing the preheated liquid raw material sent from the preheating section; a flow rate control device provided on top of the vaporizing section for controlling the flow rate of a gas sent from the vaporization section; and heaters for heating the preheating section, the vaporization section, and the flow rate control device.

In one embodiment, the heaters include a first heater for heating the preheating section, a second heater for heating the vaporization section, and a third heater for heating the flow rate control device, and are configured to independently heat the preheating section, the vaporization section, and the flow rate control device respectively.

In one embodiment, the first heater includes a first side heater for heating a side surface of the preheating section, the second heater includes a second side heater for heating a side surface of the vaporization section, the third heater includes a third side heater for heating a side surface of the portion of the flow rate control device where the gas flows.

In one embodiment, the second heater further includes a second bottom heater for heating the bottom surface of the vaporization section, the third heater further includes a third bottom heater for heating the bottom surface of the portion of the flow rate control device where the gas flows.

In one embodiment, a heat insulating member is interposed between the second bottom heater and the preheating section, and between the third bottom heater and the vaporization section, respectively.

In one embodiment, the preheating section and the vaporization section communicate with each other through an on-off valve for liquid filling and a three-way valve, and the on-off valve for liquid filling and the three-way valve are provided on top of the preheating section and the vaporization section.

Effect of Invention

In the vaporization supply apparatus according to the embodiments of the present invention, since the preheating section, the vaporization section, and the flow rate control device are stacked in the vertical direction into a three-stage structure, it is possible to decrease the installation area, as compared to the conventional vaporization supply apparatus, in which the preheating section, the vaporization section, and the flow rate control device are arranged in series. As a result, it is possible to reliably and satisfactorily install the vaporization supply apparatus even in the vicinity of the process chamber having less installation space.

DETAILED DESCRIPTION OF EMBODIMENT

Hereinafter, embodiments of the present invention will be described in detail with reference to the drawings. However, the present invention is not limited to the following embodiments.

FIGS. 1 to 4 show a vaporization supply apparatus 1 according to an embodiment of the present invention. The vaporization supply apparatus 1 includes a preheating section 2 for preheating a liquid raw material L, a vaporization section 3 provided on top of the preheating section 2 for heating and vaporizing a preheated liquid raw material L sent from the preheating section 2, a flow rate control device 4 provided on top of the vaporization section 3 for controlling the flow rate of a gas G sent from the vaporization section 3, and heaters 5 for heating the preheating section 2, the vaporization section 3, and the flow rate control device 4 to different temperatures, wherein the liquid raw material L is preheated by the preheating section 2, and the preheated liquid raw material L is vaporized by the vaporization section 3 to generate the gas G to be used in semiconductor manufacturing equipment or the like, and the generated gas G is controlled by the flow rate control device 4.

The heaters 5 include a first heater 6 for heating the preheating section 2 from a side, a second heater 7 for heating the vaporization section 3 from a side and the bottom, and a third heater 8 for heating the flow rate control device 4 from a side and the bottom, and the heaters 5 are configured to independently heat the preheating section 2, the vaporization section 3, and the flow rate control device 4 respectively.

Figure 4:
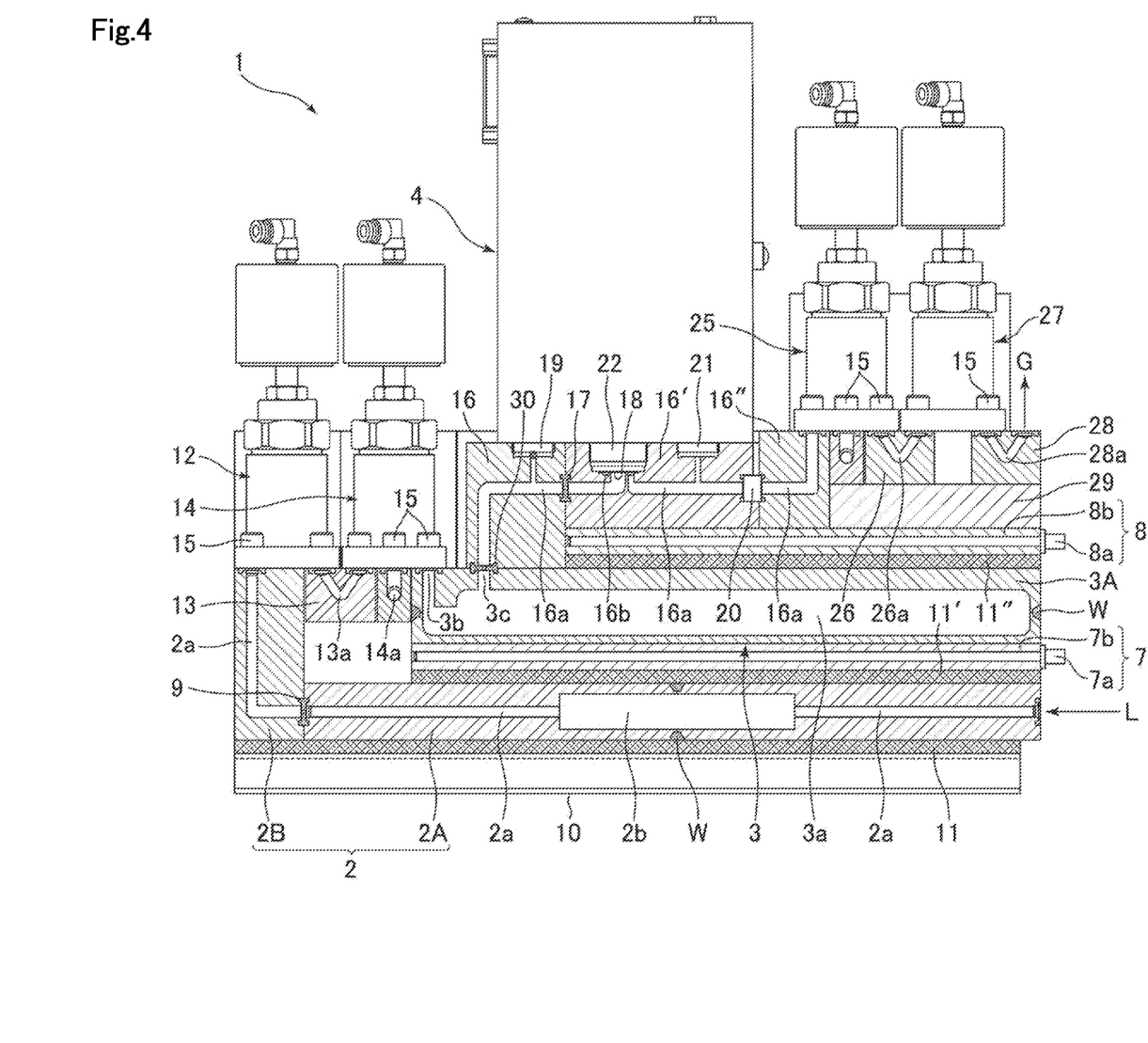
FIG. 4 is a longitudinal cross-sectional view of the vaporization supply apparatus.

The preheating section 2 is constituted by connecting a first preheating block 2A made of stainless steel and a second preheating block 2B also made of stainless steel.

The first preheating block 2A is formed in a horizontally elongated thick flat rectangular parallelepiped. Inside the first preheating block 2A, a linear flow path 2a extending from one end to the other end and a rectangular parallelepiped liquid storage chamber 2b in the middle of the linear flow path 2a for storing the liquid raw material L are formed. The first preheating block 2A is formed by joining two members divided into left and right in the central portion by, welding W and at one end of the first preheating block 2A (right end in FIG. 4), an inlet of the liquid raw material L is formed. In addition, in the first preheating block 2A, the liquid raw material L pressurized and sent from a liquid storage tank (not shown) at a predetermined pressure is stored in the liquid storage chamber 2b and preheated using the first heater 6 prior to being supplied to the vaporization section 3. In order to increase the surface area, a heating accelerator (not shown) may be provided in the liquid storage chamber 2b of the first preheating block 2A.

The second preheating block 2B is formed in a vertically long rectangular parallelepiped, inside the second preheating block 2B, an L-shaped flow path 2a communicating with the flow path 2a of the first preheating block 2A is formed. The second preheating block 2B is connected to the other end of the first preheating block 2A by a bolt (not shown) or the like, and at the communication portion of the flow paths 2a of the first preheating block 2A and the second preheating block 2B, a gasket 9 having a through-hole is interposed. An outlet for the liquid material L is formed on the top surface of the second preheating block 2B.

The first preheating block 2A and the second preheating block 2B forming the preheating section 2 is provided on top of a base frame 10 while being connected to each other. Between the bottom surface of the first preheating block 2A and the top surface of the base frame 10 and between the bottom surface of the second preheating block 2B and the top surface of the base frame 10, a plate-shaped heat insulating member 11 is provided. The heat insulating member 11 may be fixed by being sandwiched between the preheating section 2 (the first preheating block 2A and the second preheating block 2B) and the base frame 10 or may be fixed using a jig or the like.

In the present embodiment, a panel material made of a resin (for example, PEEK (Poly Ether Ether Ketone) is used as the heat insulating member 11. The thickness of the heat insulating member 11 may be appropriately selected according to the required heat insulation, but may be, for example, about 5 mm to 10 mm.

In addition, the heat insulating member 11 is not limited to the above-mentioned one made of PEEK and may be formed of any material as long as heat can be insulated, or a material or the like may be appropriately selected in accordance with temperatures. As the heat insulating member 11, it is also possible to utilize a known vacuum insulation panel.

In the above embodiment, the first preheating block 2A and the second preheating block 2B forming the preheating section 2 are formed separately, but in other embodiments, the first preheating block 2A and the second preheating block 2B may be formed integrally.

The vaporization section 3 includes a vaporization block 3A made of stainless steel and is connected to the second preheating block 2B of the preheating section 2 via a liquid-filling on-off valve 12, a flow path block 13 made of stainless steel, and a purging three-way valve 14.

The vaporization block 3A is formed in a rectangular parallelepiped of a horizontally elongated thick flat plate, and a vaporization chamber 3a in the shape of a rectangular parallelepiped is formed inside the vaporization block 3A. The vaporization block 3A is formed by joining two members divided into upper and lower in the central portion by welding W. On top of one end portion of the vaporization block 3A (left end portion in FIG. 4), an inlet 3b for the liquid raw material L, that is connected in communication with the purging three-way valve 14 in a communication state and is communicating with the vaporization chamber 3a, and an outlet 3c for the gas G, that is connected in communication with the flow rate control device 4 and is communicating with the vaporization chamber 3a, are formed. The length of the vaporization block 3A (the length in the lateral direction in FIG. 4) is set to be shorter than the length of the first preheating block 2A, also the width of the vaporization block 3A (the length in the longitudinal direction in FIG. 4) is set to be the same as the width of the first preheating block 2A.

The vaporization block 3A forming the vaporization section 3 is provided on top of the first preheating block 2A of the preheating section 2, and a plate-shaped heat insulating member 11' and a second bottom heater 7B of a second heater 7 to be described later are interposed between the top surface of the first preheating block 2A and the bottom surface of the vaporization block 3A. The heat insulating member 11' is interposed between the first preheating block 2A and the vaporization block 3A so as to contact the top surface of the first preheating block 2A, and the second bottom heater 7B is interposed to contact the top surface of the heat insulating member 11' and the bottom surface of the vaporization block 3A. The heat insulating member 11' and the second bottom heater 7B may be fixed by being sandwiched between the first preheating block 2A and the vaporization block 3A or may be fixed using a jig or the like.

In the present embodiment, a panel material made of PEEK is used as the heat insulating member 11'. The thickness of the heat insulating member 11' is set to be the same as the heat insulating member 11 interposed between the first preheating block 2A and the base frame 10.

The vaporization section 3 may be provided with a liquid detector (not shown) for detecting that the liquid raw material L exceeding a predetermined amount is supplied into the vaporization chamber 3a, and when the liquid detector detects the liquid, the liquid filling on-off valve 12 is closed, thereby preventing excessive supply of the liquid raw material LL to the vaporization section 3. As the liquid detector, as described in Patent Document 4 (International Publication No. 2016/174832), a thermometer (platinum temperature measurement resistor, thermocouple, thermistor, or the like), a level gauge, a load cell, or the like provided in the vaporization chamber 3a may be used.

The liquid filling on-off valve 12 controls the supply amount of the liquid raw material L to the vaporization section 3 in accordance with the pressure in the vaporization chamber 3a of the vaporization block 3A. As the liquid filling on-off valve 12, an air operated valve for controlling the opening and closing of the valve body by utilizing the air pressure is used. The liquid filling on-off valve 12 is fixed on the top surface of the second preheating block 2B by a fixing bolt 15, so that its inlet is connected in communication with the outlet of the liquid raw material L of the second preheating block 2B, a gasket (not shown) having a through-hole is interposed between the inlet of the liquid filling on-off valve 12 and the outlet of the second preheating block 2B, and the gasket having the through-hole forms a seal between the flow path by the fastening force of the fixing bolt 15.

The flow path block 13 communicates the outlet of the liquid filling on-off valve 12 and the inlet of the three-way purge valve 14 and a flow path 13a for the liquid raw material L is formed inside the flow path block 13. The flow path block 13 is fixed to the bottom surfaces of the liquid filling on-off valve 12 and the three-way purge valve 14 by fixing bolt 15, in a state where the flow path 13a communicates with the outlet of the liquid filling on-off valve 12 and the inlet of the three-way purge valve 14, and a gasket (not shown) having a through-hole is interposed between the outlet of the liquid filling on-off valve 12 and the inlet of the flow path 13a of the flow path block 13, and between the inlet of the three-way purge valve 14 and the outlet of the flow path 13a of the flow path block 13, respectively, the gasket having a through-hole forms a seal between the flow paths by the fastening force of the fixing bolt 15.

The three-way purge valve 14 is used for flowing the purge gas to the flow rate control device 4. The three-way purge valve 14 includes an inlet of the liquid raw material L, an outlet of the liquid raw material L, and an inlet 14a of the purge gas. As the three-way purge valve 14, an air operated valve for controlling the opening and closing of the valve element using air pressure is used, when closing the valve element, the inlet 14a of the purge gas is closed, and the inlet of the liquid raw material L and the outlet of the liquid raw material L is communicated, also, when opening the valve element, the inlet 14a of the purge gas and the outlet of the liquid raw material L is communicated. The three-way purge valve 14 is fixed by a fixing bolt 15 to one end portion top surface of the vaporization block 3A, in a state where the outlet is communicated with the inlet 3b of the liquid raw material L of the vaporization block 3A, a gasket having a through-hole (not shown) is interposed between the outlet of the three-way purge valve 14 and the inlet 3b for the liquid raw material L of the vaporization block 3A, the gasket having the through-hole forms a seal between the flow path by the fastening force of the fixing bolt 15.

The flow rate control device 4 in the present embodiment is a known pressure type flow rate control device 4 for high temperature, as described later, the flow rate of the gas G flowing through an orifice member 20 can be controlled by adjusting the upstream pressure P1 of the orifice member 20 by using a control valve 22.

That is, the pressure type flow rate control device 4 includes an upstream valve block 16 forming a gas flow path 16a; an intermediate valve block 16' forming the gas flow path 16a, that is connected to the upstream valve block 16 and communicating with the gas flow path 16a of the upstream valve block 16, and a valve chamber 16b; an downstream valve block 16" forming the gas flow path 16a, that is connected to the intermediate valve block 16' and communicating with the gas flow path 16a of the intermediate valve block 16'; a gasket 17 having a through-hole interposed between the gas flow path 16a of the upstream valve block 16 and the gas flow path 16a of the intermediate valve block 16'; a metal diaphragm valve element 18 provided in the valve chamber 16b; a piezoelectric driven element for driving the metal diaphragm valve element 18 (not shown); a pressure detector 19 for detecting the pressure in the gas flow path 16a upstream of the metal diaphragm valve element 18; an orifice member 20 having a fine hole and provided in the gas flow path 16a downstream of the metal diaphragm valve element 18; and a flow rate control pressure detector 21 for detecting the pressure in the gas flow path 16a between the metal diaphragm valve element 18 and the orifice member 20.

The pressure type flow rate control device 4 for high temperature is configured so as to close the gas flow path 16a by abutting the metal diaphragm valve element 18 on the valve seat, when the piezoelectric driven element is not energized, on the other hand, when the piezoelectric driven element extends by being energized, the metal diaphragm valve element 18 returns to the original reversed dish shape by self-elastic force to open the gas flow path 16a.

Figure 5:
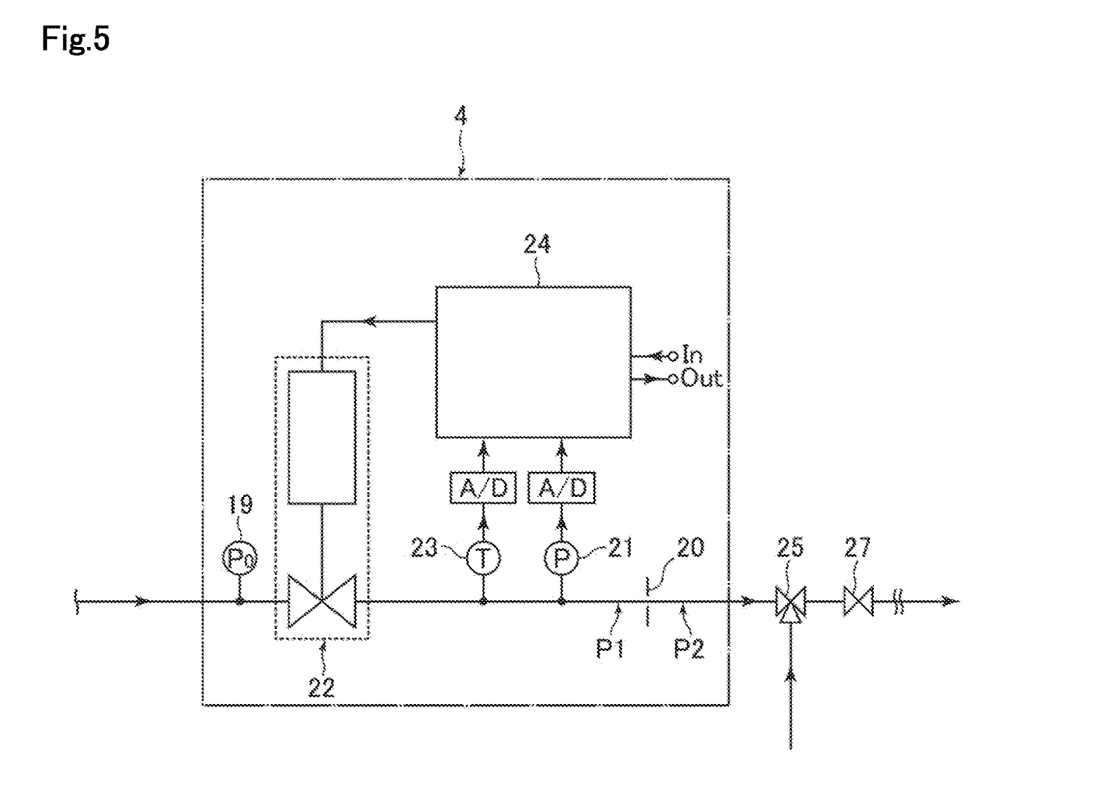
FIG. 5 is a schematic diagram showing a configuration example of a flow rate control device used in the vaporization supply apparatus.

FIG. 5 is a schematic diagram showing a configuration example of the pressure type flow rate control device 4. The pressure type flow rate control device 4 includes a pressure detector 19; an orifice member 20; a control valve 22 composed of a metal diaphragm valve element 18 and a piezoelectric driven element, a flow rate control pressure detector 21 and a temperature detector 23 provided between the orifice member 20 and the control valve 22. The orifice member 20 is provided as a restriction part, and a critical nozzle or a sonic nozzle may be used instead. The aperture of the orifice or the nozzle is set to, for example, 10 μm to 500 μm.

The pressure detector 19 and the temperature detector 23 are connected to a control circuit 24 via an AD converter. The AD converter may be incorporated in the control circuit 24. The control circuit 24 is also connected to the control valve 22, generates a control signal based on the output of the flow rate control pressure detector 21 and the temperature detector 23, and controls the operation of the control valve 22 by the control signal.

The pressure type flow rate control device 4 can perform the same flow rate control operation as in the prior art, it is possible to control the flow rate based on the upstream pressure P1 (the pressure upstream of the orifice member 20) using the flow rate control pressure detector 21. In other embodiments, the pressure type flow rate control device 4 may also include a pressure detector (not shown) downstream of the orifice member 20, and may be configured to detect the flow rate based on the upstream pressure P1 and downstream pressure P2.

The pressure type flow rate control device 4 performs the flow rate control by utilizing the following principle: when the critical expansion condition P1/P2≥about 2 is satisfied (where P1 is the gas pressure upstream of the restriction part (upstream pressure), P2 is the gas pressure downstream of the restriction part (downstream pressure), about 2 is in the case of nitrogen gas), the flow velocity of the gas G passing through the restriction part is fixed to the sound velocity, the flow rate is determined by the upstream pressure P1 regardless of the downstream pressure P2. When the critical expansion condition is satisfied, the flow rate Q downstream of the restriction part is given by $Q = K_1 \, P1$, where $K_1$ is a constant dependent on the fluid species and the fluid temperature, and the flow rate Q is proportional to the upstream pressure P1. Further, a downstream pressure sensor is provided, the difference between the upstream pressure P1 and the downstream pressure P2 is small, it is possible to calculate the flow rate even when the critical expansion condition is not satisfied. Based on the upstream pressure P1 and downstream pressure P2 measured by each pressure sensor, it is possible to calculate the flow rate Q from a predetermined calculation formula $Q = K_2 \cdot P2^m (P1-P2)^n$, where $K_2$ is a constant depending on the fluid species and fluid temperature, and m, n are indices derived from the actual flow rate.

The control circuit 24 obtains the flow rate by calculation from the above $Q = K_1 \, P1$ or $Q = K_2 \cdot P2^m (P1-P2)^n$ based on the output (upstream pressure P1) of the flow rate control pressure detector 21 or the like, and feedback-controls the control valve 22 so that the flow rate approaches the set flow rate input by the user. The flow rate determined by the calculation may be displayed as a flow rate output value.

Further, the pressure detector 19 provided upstream of the metal diaphragm valve element 18 of the pressure type flow rate control device 4 is used for detecting the pressure of the gas G vaporized in the vaporization section 3 and sent to the pressure type flow rate control device 4.

The signal of the detected pressure value of the pressure detector 19 is always sent to the control circuit 24 to be monitored. When the liquid raw material L in the vaporization chamber 3a of the vaporization section 3 decreases due to vaporization, the internal pressure of the vaporization chamber 3a decreases. When the liquid raw material L in the vaporization chamber 3a decreases, the internal pressure in the vaporization chamber 3a decreases, and the detected pressure of the pressure detector 19 reaches a preset value, the control circuit 24 supplies a predetermined amount of the liquid raw material L to the vaporization chamber 3a by opening the liquid filling on-off valve 12 for a predetermined time and then closing it. When a predetermined amount of the liquid raw material L is supplied to the vaporization chamber 3a, the gas pressure in the vaporization chamber 3a rises again due to the vaporization of the liquid raw material L, and then the internal pressure in the vaporization chamber 3a decreases again due to the decrease of the liquid raw material L. Then, when the internal pressure in the vaporization chamber 3a reaches the set value, as described above, close the liquid filling on-off valve 12 again after opening it for a predetermined time. By such sequence control, a predetermined amount of the liquid raw material L is successively replenished in the vaporization chamber 3a.

Furthermore, in the downstream valve block 16" of the pressure type flow rate control device 4, the purge gas supply three-way valve 25, the second flow path block 26, the stop valve 27, the third flow path block 28 are sequentially connected. In addition, the purge gas supply three-way valve 25, the second flow path block 26, the stop valve 27, and the third flow path block 28 are supported by a rectangular parallelepiped base body 29 made of stainless steel disposed at a lower position under them. Further, the second flow path block 26 and the third flow path block 28 are made of stainless steel and are configured in the same structure as the above-described flow path block 13.

The purge gas supply three-way valve 25 is provided for flowing purge gas downstream of the pressure type flow rate control device 4, and includes an inlet of the gas G; an outlet of the gas G; and an inlet 25a of the purge gas. As the purge gas supply three-way valve 25, an air operated valve for controlling the opening and closing of the valve element by utilizing air pressure is used, when closing the valve element, the inlet 25a of the purge gas is closed and communicates with the inlet of the gas G and the outlet of the gas G, also, when opening the valve element, the inlet 25a of the purge gas and the outlet of the gas G are communicated. The purge gas supply three-way valve 25 is fixed to the top surfaces of the downstream valve block 16" and the second flow path block 26 by fixing bolts 15, in a state where the inlet of the gas G communicates with the gas flow path 16a of the downstream valve block 16", and the outlet of the gas G communicates with the gas flow path 26a of the second flow path block 26, and a gasket having a through hole (not shown) is interposed between the inlet of the gas G of the purge gas supply three-way valve 25 and the gas flow path 16a of the downstream valve block 16", and between the outlet of the gas G of the purge gas supply three-way valve 25 and the gas flow path 26a of the second flow path block 26, respectively, and the gasket having a through-hole form a seal between the flow paths by the fastening force of the fixing bolts 15.

The stop valve 27 is for shutting off the flow of the gas G as needed, as the stop valve 27, for example, a known air operated valve or a solenoid valve may be used. The stop valve 27 is fixed by the fixing bolt 15 on the top surfaces of the second flow path block 26 and the third flow path block 28, in a state where the inlet of the gas G communicates with the gas flow path 26a of the second flow path block 26, and the outlet of the gas G communicates with the gas flow path 28a of the third flow path block 28 respectively, a gasket having a through hole (not shown) is interposed between the inlet of the gas G of the stop valve 27 and the flow path 26a of the second flow path block 26, and between the outlet of the gas G of the stop valve 27 and the gas flow path 28a of the third flow path block 28 respectively, the gasket having a through hole forms a seal between the flow paths by the fastening force of the fixing bolt 15. The downstream of the stop valve 27, for example, is connected to a process chamber (not shown) of semiconductor manufacturing equipment, the interior of the process chamber during gas supply is depressurized by a vacuum pump (not shown), and a predetermined flow rate of the raw material gas G is supplied to the process chamber.

Then, the flow rate control device 4 is provided on top of the vaporization block 3A, so that the gas flow path 16a of the upstream valve block 16 communicates with the outlet 3c of the gas G of the vaporization block 3A, and the gasket 30 having a through hole is interposed between the inlet of the gas flow path 16a of the upstream valve block 16 and the outlet 3c of the gas G of the vaporization block 3A, the gasket 30 having a through hole forms a seal between the flow paths by the fastening force of the fixing bolt (not shown).

Further, between the flow rate control device 4 and the vaporization block 3A forming the vaporization section 3, and between the base 29 and the vaporization block 3A, a plate-shaped heat insulating member 11" and a third bottom heater 8B of a third heater 8, which is to be described later, are interposed. The heat insulating member 11" is in contact with the top surface of the vaporization block 3A, also the third bottom heater 8B is interposed between the vaporization block 3A and the flow rate control device 4, and between the vaporization block 3A and the base body 29, so as to contact the top surface of the heat insulating member 11", the bottom surface of the intermediate valve block 16', the bottom surface of the downstream valve block 16", and the bottom surface of the base body 29. The heat insulating member 11" and the third bottom heater 8B may be fixed as being sandwiched between the vaporization block 3A and the flow rate control device 4 or the like, or may be fixed using a jig or the like.

In the present embodiment, a panel material made of PEEK is used as the heat insulating member 11". The thickness of the heat insulating member 11" is set to be the same as the heat insulating member 11 interposed between the first preheat block 2A and the base frame 10.

Note that, the flow rate control device 4 is not limited to the pressure type flow rate control device, it may be a flow rate control device 4 of various types.

The heater 5 for heating the preheating section 2, the vaporization section 3, and the flow rate control device 4 to different temperatures respectively, includes a first heater 6 for heating the preheating section 2 from the side, a second heater 7 for heating the vaporization section 3 from the side and the bottom, a third heater 8 for heating the portion where the gas G of the flow rate control device 4 flows, from the side and the bottom surface.

The first heater 6 includes a pair of first side heater 6A for heating both sides of the first preheating block 2A and the second preheating block 2B, which forms the preheating section 2, a portion where the liquid raw material L of the liquid filling on-off valve 12 flows, and both sides of the inlet-side portion of the flow path block 13.

The pair of the first side heater 6A includes a heating element 6a, and a metal heat transfer member 6b thermally connected to the heating element 6a, respectively, heat generated by the heating element 6a is conducted to the entire heat transfer member 6b, so that the heat transfer member 6b is heated by the heating element 6a entirely. The uniformly heated heat transfer member 6b can uniformly heat the preheating section 2, a portion of the liquid filling on-off valve 12, and a portion of the flow path block 13 from outside.

The heating element 6a is composed of a rod-shaped cartridge heater and is inserted and fixed to a fine hole formed in the heat transfer member 6b.

The heat transfer member 6b is formed in an L-shaped plate made of aluminum or aluminum alloy and is fixed in close contact on the side surface of the first preheat block 2A and the second preheat block 2B by fixing bolts (not shown) or the like. The size of the heat transfer members 6b is formed to be able to cover the side surfaces of the first pre-heating block 2A and the second pre-heating block 2B, the side surface of the portion of the liquid filling on-off valve 12 where the liquid raw material L flows, and the side of the inlet side of the flow path block 13 respectively. The heat transfer member 6b may be made of a material having good heat transfer efficiency, aluminum or aluminum alloy is preferable because of less contamination to the process and its relatively inexpensive price.

The second heater 7 includes a pair of second side heater 7A for heating both sides of the vaporization block 3A forming the vaporization section 3, a portion where the liquid raw material L of the purging three-way valve 14 flows, and both sides of the outlet-side portion of the flow path block 13, and a second bottom heater 7B for heating the bottom surface of the vaporization block 3A forming the vaporization section 3.

The pair of the second side heater 7A and the second bottom heater 7B includes a heating element 7a and a metallic heat transfer member 7b that is thermally connected to the heating element 7a respectively, heat generated by the heating element 7a is conducted to the entire heat transfer member 7b, so that the heating member 7b is heated by the heating element 7a entirely. The uniformly heated heat transfer member 7b can uniformly heat the vaporization section 3, a part of the three-way purge valve 14, and the flow path block 13 from the outside.

The heating element 7a of the second side heater 7A and the second bottom heaters 7B is composed of a rod-shaped cartridge heater, respectively, and is inserted and fixed to the fine hole formed in the heat transfer member 7b.

The heat transfer member 7b of the second side heater 7A is formed in an L-shaped plate made of aluminum or an aluminum alloy and is fixed in close contact to the side surface of the vaporization block 3A by fixing bolts (not shown) or the like. The size of the heat transfer member 7b of the second side heater 7A is formed to be able to cover the side surface of the vaporization block 3A, the side surface of the portion where the liquid raw material L of the purging three-way valve 14 flows, the side of the outlet side portion of the flow path 13a of the flow path block 13, respectively.

The heat transfer member 7b of the second bottom heater 7B is formed in an elongated plate shape by aluminum or an aluminum alloy and is provided in close contact between the vaporization block 3A and the heat insulating member 11' on the first preheating block 2A, and between the bottom surface of the vaporization block 3A and the top surface of the heat insulating member 11' respectively.

The third heater 8 includes a pair of third side heater 8A for heating both sides of the upstream valve block 16, and both sides of the intermediate valve block 16', and both sides of the downstream valve block 16", a portion of the purge gas supply three-way valve 25 where the gas G flows, both sides of the second flow path block 26, a portion of the stop valve 27 where the gas G flows, and both sides of the third flow path block 28, and a third bottom heater 8B for heating the bottom surface of the intermediate valve block 16', the bottom surface of the downstream valve block 16", the bottom surface of the purge gas supply three-way valve 25, the bottom surface of the second flow path block 26, and the bottom surface of the third flow path block 28.

The pair of the third side heater 8A and the third bottom heater 8B respectively includes a heating element 8a, and a metallic heat transfer member 8b that is thermally connected to the heating element 8a, the heat generated by the heating element 8a is conducted to the entire heat transfer member 8b, so that the heat transfer member 8b is heated by the heating element 8a entirely. The uniformly heated heat transfer member 8b can uniformly heat a portion of the flow rate control device 4 where the gas G flows, a portion of the purge gas supply three-way valve 25, the second flow path block 26, a portion of the stop valve 27 and the third flow path block 28 from the outside.

The heating element 8a of the third side heater 8A and the third bottom heater 8B is composed of a rod-shaped cartridge heater and is inserted and fixed to the fine hole formed in the heat transfer member 8b respectively.

The heat transfer member 8b of the third side heater 8A is formed in a plate shape by aluminum or an aluminum alloy and is fixed in close contact with the side of the flow rate control device 4 by fixing bolts (not shown) or the like. The size of the heat transfer member 8b of the third side heater 8A is formed to respectively cover the side of the upstream valve block 16, the side of the intermediate valve block 16', the side of the downstream valve block 16", the side of the portion of the purge gas supply three-way valve 25 where the gas G flows, the side of the second flow path block 26, the side of the portion of the stop valve 27 where the gas G flows and the side of the third flow path block 28.

The heat transfer member 8b of the third bottom heater 8B is formed in an elongated plate shape by aluminum or an aluminum alloy, and is provided between the intermediate valve block 16', the downstream valve block 16", the base 29, and the heat insulating member 11" on the vaporization block 3A, in close contact with the bottom surface of the intermediate valve block 16', the bottom surface of the downstream valve block 16", the bottom surface of the base 29 and the top surface of the heat insulating member 11", respectively.

In the first heater 6, the second heater 7, and the third heater 8 described above, on the inner surfaces of the heat transfer members 6b, 7b, 8b made of aluminum or an aluminum alloy, that is the surfaces facing the preheating section 2, the vaporization section 3, and the flow rate control device 4, are subjected to anodizing process as a surface treatment for improving the heat dissipation (anodizing treatment), also, the outer surfaces of the heat transfer members 6b, 7b, 8b are polished surfaces or mirror processed surfaces. The mirror-finished surfaces of the outside of the heat transfer members 6b, 7b, 8b are typically formed by polishing, but may be formed only by grinding.

By anodizing treatment on the inner surfaces of the heat transfer members 6b, 7b, 8b (e.g., hard anodizing), heat dissipation can be improved, and when they are contacted, the heat of the heating elements 6a, 7a, 8a are directly conducted from the heat transfer members 6b, 7b, 8b to the preheating section 2 or the vaporization section 3 or the like, even when there is a distance between the heat transfer members 6b, 7b, 8b and the vaporization section 3 or the like, due to high radioactivity (high radiant heat), the heat can be transmitted to the vaporization section 3 or the like uniformly and with improved efficiency. Further, in the case where the heat transfer members 6b, 7b, 8b are in contact with the preheating section 2 and the vaporization section 3, the heat is conducted from the contact portions, but when the heat moves from the heat transfer members 6b, 7b, 8b to the preheating section 2 and the vaporization section 3, if the inner surfaces of the heat transfer members 6b, 7b, 8b are not anodized, the heat is reflected at the inner surfaces of the heat transfer members 6b, 7b, 8b due to radiation, some heat may not move to the preheating section 2 and the vaporization section 3. In contrast, as in the present embodiment, when the inner surfaces of the heat transfer members 6b, 7b, 8b are anodized, since the radiation rate is high, there is almost no heat reflected by the surface in contact with the preheating section 2 and the vaporization section 3, almost all heat from the heat transfer members 6b, 7b, 8b are conducted to the preheating section 2 and the vaporization section 3.

Furthermore, by mirror processing the outer surface of the heat transfer members 6b, 7b, 8b, heat dissipation effect to the outside of each of the heaters 6, 7, 8 can be suppressed. Thus, the advantage of energy saving can be achieved. It should be noted that the same effect is exhibited not only in the hard anodizing treatment but also in the usual anodizing treatment. The thickness of the anodizing layer exhibits the same effect as long as the thickness is 1 μm or more, for example, which is formed by normal anodizing treatment. However, the hard anodizing treatment has the advantage of hardly causing scratch during operation, and less concern of film peeling compared with the normal anodizing treatment.

Further, since a temperature sensor is provided to each of the preheating section 2, the vaporization section 3, and the flow rate control device 4 (not shown), so that the each of the heaters 6, 7, 8 may be individually controlled using the control device (not shown), the temperature of the preheating section 2, the vaporization section 3, and the flow rate control device 4 can be individually controlled. Usually, the temperatures of the preheating section 2, the vaporization section 3, and the flow rate control device 4 are controlled so as the preheating section 2<the vaporization section 3<the flow rate control device 4.

The temperature of the first heater 6 is set to, for example, about 180° C., the temperature of the second heater 7 is set to, for example, about 200° C., and the temperature of the third heater 8 is set to, for example, about 210° C. Usually, the first heater 6 for heating the preheating section 2 is set to a temperature lower than the second heater 7 for heating the vaporization section 3, the third heater 8 for heating the flow rate control device 4 is set to a temperature higher than the second heater 7. Therefore, the temperatures of the preheating section 2, the vaporization section 3, and the flow rate control device 4 become the preheating section 2<the vaporization section 3<the flow rate control device 4.

In the above embodiment, rod-shaped cartridge heaters are used as the heating elements 6a, 7a, 8a of each of the hearers 6, 7, 8, but various known heating devices may be used as the heating elements 6a, 7a, 8a, and, for example, planar heaters (not shown) fixed to the heat transfer members 6b, 7b, 8b may be used.

Further, in the above embodiment, the heating elements 6a, 7a, 8a are inserted into the heat transfer members 6b, 7b, 8b from the lateral direction, however, in other embodiments, the heating elements 6a, 7a, 8a may be inserted into the heat transfer members 6b, 7b, 8b from the longitudinal direction.

Furthermore, in the above embodiment, as the heat transfer members 6b, 7b, 8b of each heater 6, 7, 8, a plate material of aluminum or aluminum alloy is used, in the heat transfer members 6b, 7b, 8b, other metal materials having high thermal conductivity may be used, in addition to aluminum or aluminum alloy.

Figure 1:
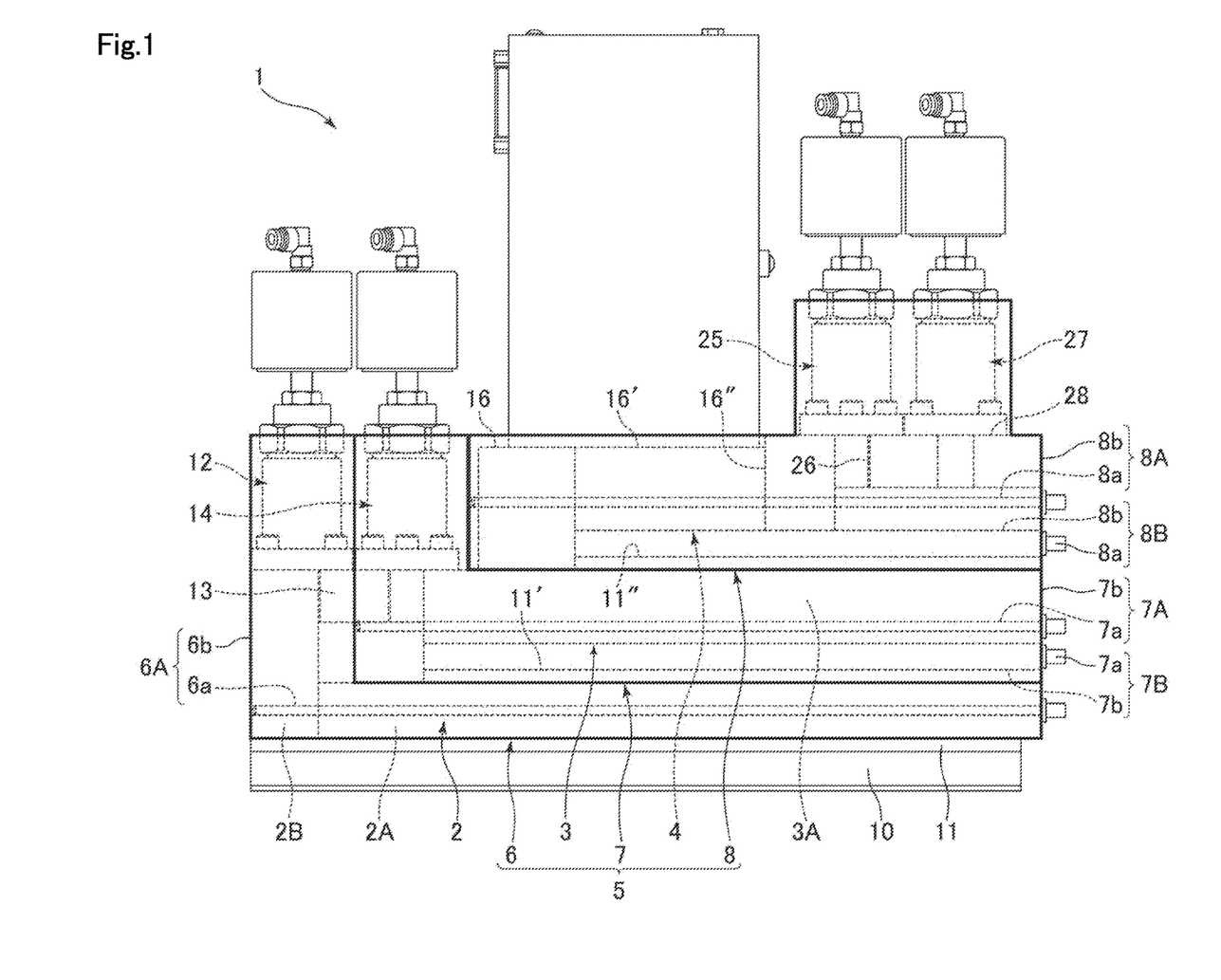
FIG. 1 is a front view of a vaporization supply apparatus according to an embodiment of the present invention.
Figure 2:
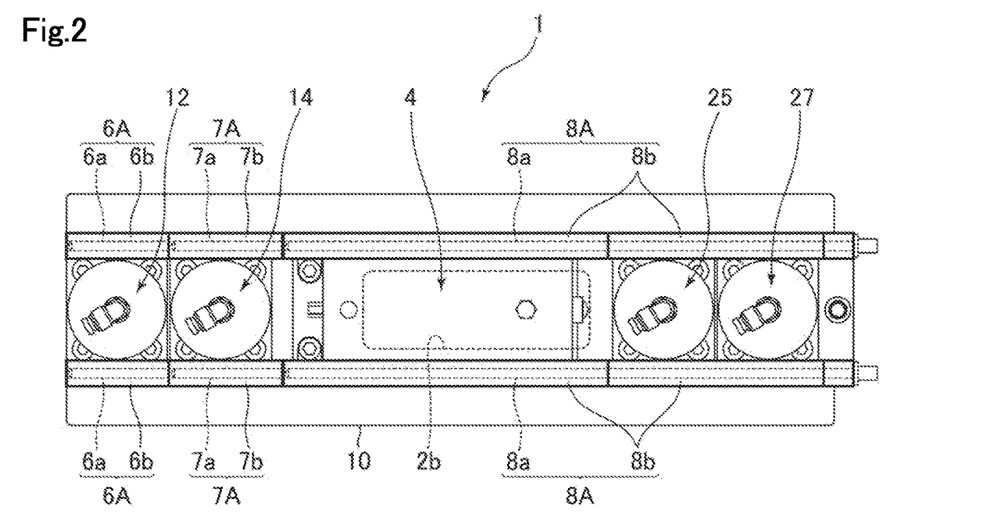
FIG. 2 is a plan view of the vaporization supply apparatus.
Figure 3:
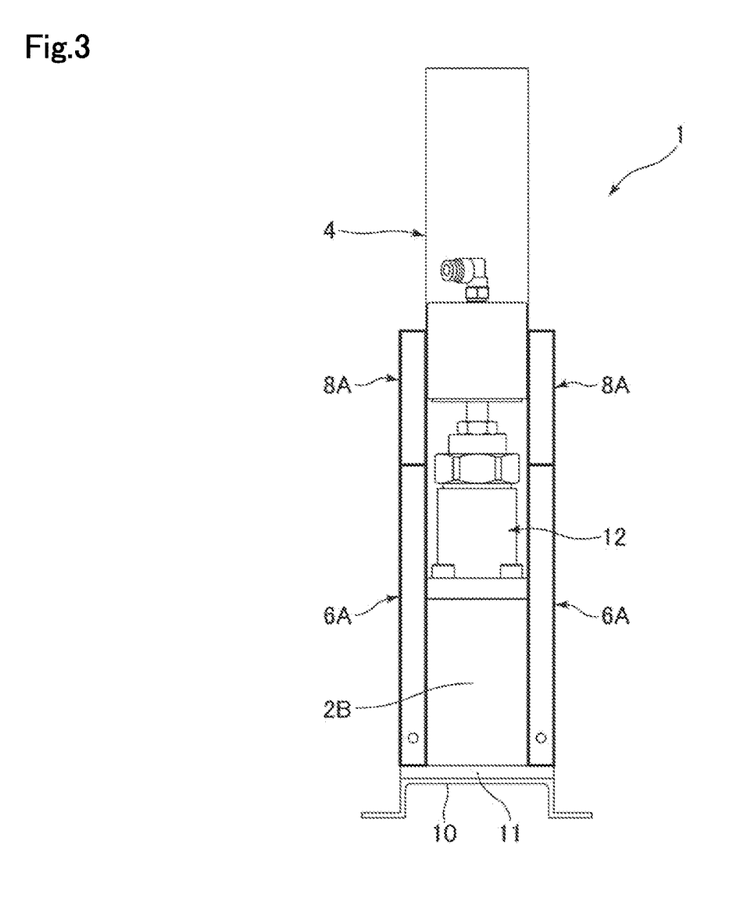
FIG. 3 is a left side view of the vaporization supply apparatus.

Thus, in the vaporization supply apparatus 1 described above, since the preheating section 2, the vaporization section 3, and the flow rate control device 4 are stacked in the vertical direction to form a three-stage structure, it is possible to reduce the installation space, as compared to the conventional vaporization supply apparatus, in which the preheating section 2, the vaporization section 3, and the pressure type flow rate control device 4 are arranged in series.

Further, in the vaporization supply apparatus 1, since each of the heaters 6, 7, 8 can be individually controlled using a control device (not shown), temperatures of the preheating section 2, the vaporization section 3, and the flow rate control device 4 can be individually controlled respectively, the preheating of the liquid raw material L, the vaporization of the liquid raw material L, the prevention of reliquefaction of the vaporized raw material can be performed at an appropriate temperature.

Furthermore, in the vaporization supply apparatus 1, since insulation members 11' and 11" are interposed between the preheating section 2 and the vaporization section 3, and between the vaporization section 3 and the flow rate control device 4, heat conduction from the flow rate control device 4 to the vaporization section 3, and heat conduction from the vaporization section 3 to the preheating section 2 may be suppressed respectively, so that the vaporization section 3 and the preheating section 2 may be maintained at set temperatures.

INDUSTRIAL APPLICABILITY

The fluid control device according to the embodiments of the present invention can be used, for example, for supplying a raw material gas to a processing chamber in a semiconductor manufacturing equipment for MOCVD.

REFERENCE SIGNS LIST

1 Vaporization supply apparatus
2 Preheating section
3 Vaporization section
4 Flow rate control device
5 Heaters
6 First heater
6A First side heater
7 Second heater
7A Second side heater
7B Second bottom heater
8 Third heater
8A Third side heater
8B Third bottom heater
11,11',11" Heat insulation member
G Gas
L Liquid raw material

What is claimed is:

1. A vaporization supply apparatus comprising:
a preheating section for preheating a liquid raw material;
a vaporization section provided on top of the preheating section for heating and vaporizing a preheated liquid raw material sent from the preheating section;
a flow rate control device provided on top of the vaporization section for controlling a flow rate of a gas sent from the vaporization section; and
heaters for heating the preheating section, the vaporization section, and the flow rate control device,
wherein a first heat insulating member is provided between the preheating section and the vaporization section and a second heat insulating member is provided between the vaporization section and the flow rate control device.

2. The vaporization supply apparatus according to claim 1, wherein the heaters include a first heater for heating the preheating section, a second heater for heating the vaporization section, and a third heater for heating the flow rate control device, and the heaters are configured to independently heat each of the preheating section, the vaporization section, and the flow rate control device respectively.

3. The vaporization supply apparatus according to claim 2, wherein the first heater comprises a first side heater for heating a side surface of the preheating section; the second heater comprises a second side heater for heating a side surface of the vaporization section, and the third heater comprises a third side heater for heating a side surface of a portion of the flow rate control device where the gas flows.

4. The vaporization supply apparatus according to claim 3, wherein the second heater further comprises a second bottom heater for heating a bottom surface of the vaporization section, and the third heater further comprises a third bottom heater for heating a bottom surface of the portion of the flow rate control device where the gas flows.

5. The vaporization supply apparatus according to claim 4, wherein the first heat insulating member is provided between the second bottom heater and the preheating section, and the second heat insulating member is provided between the third bottom heater and the vaporization section respectively.

6. The vaporization supply apparatus according to claim 1, wherein the preheating section and the vaporization section communicate with each other via a liquid filling on-off valve and a three-way valve, the liquid filling on-off valve and the three-way valve being provided on top of the preheating section and the vaporization section.

7. A vaporization supply apparatus comprising:
a preheating section for preheating a liquid raw material;
a vaporization section provided on top of the preheating section for heating and vaporizing a preheated liquid raw material sent from the preheating section;
a flow rate control device provided on top of the vaporization section for controlling a flow rate of a gas sent from the vaporization section; and
heaters for heating the preheating section, the vaporization section, and the flow rate control device,
wherein the preheating section and the vaporization section communicate with each other via a liquid filling on-off valve and a three-way valve, the liquid filling on-off valve and the three-way valve being provided on top of the preheating section and the vaporization section.

* * * * *